(12) United States Patent
Nagarkatti et al.

(10) Patent No.: US 8,624,501 B2
(45) Date of Patent: Jan. 7, 2014

(54) MEASURING AND CONTROLLING PARAMETERS OF A PLASMA GENERATOR

(75) Inventors: Siddharth P. Nagarkatti, Acton, MA (US); Ali Shajii, Weston, MA (US); Souheil Benzerrouk, Hudson, NH (US)

(73) Assignee: MKS Instruments, Inc., Andover, MA (US)

( * ) Notice: Subject to any disclaimer, the term of this patent is extended or adjusted under 35 U.S.C. 154(b) by 470 days.

(21) Appl. No.: 12/963,209

(22) Filed: Dec. 8, 2010

(65) Prior Publication Data

US 2012/0146508 A1 Jun. 14, 2012

(51) Int. Cl.
*H01J 7/24* (2006.01)

(52) U.S. Cl.
USPC .................. 315/111.51; 315/352; 315/354

(58) Field of Classification Search
USPC ........ 315/111.51, 344, 352, 354; 156/345.48, 156/345.49
See application file for complete search history.

(56) References Cited

U.S. PATENT DOCUMENTS

| | | | |
|---|---|---|---|
| 6,150,628 A * | 11/2000 | Smith et al. | 219/121.54 |
| 6,388,226 B1 * | 5/2002 | Smith et al. | 219/121.57 |
| 6,486,431 B1 * | 11/2002 | Smith et al. | 219/121.57 |
| 6,559,408 B2 * | 5/2003 | Smith et al. | 219/121.57 |
| 7,541,558 B2 * | 6/2009 | Smith et al. | 219/121.41 |
| 7,569,790 B2 * | 8/2009 | Holber et al. | 219/121.41 |
| 2004/0150386 A1 | 8/2004 | Gonzalez et al. | |
| 2006/0086699 A1 | 4/2006 | Holber et al. | |
| 2006/0088655 A1 | 4/2006 | Collins et al. | |
| 2008/0179948 A1 | 7/2008 | Nagarkatti et al. | |
| 2009/0218324 A1 | 9/2009 | Or et al. | |

FOREIGN PATENT DOCUMENTS

WO WO-2006/078340 A2 7/2006

OTHER PUBLICATIONS

International Search Report for PCT/US2011/057814, Dec. 30, 2011, 12 pages.

* cited by examiner

*Primary Examiner* — Thuy Vinh Tran
(74) *Attorney, Agent, or Firm* — Proskauer Rose LLP

(57) ABSTRACT

Methods, systems, and computer program products are described for measuring and controlling parameters of a plasma generator. A current in a primary winding of a transformer or inductive element that generates a plasma is measured. A voltage across a secondary winding of the transformer or inductive element is measured. Based on the current of the primary winding and the voltage across the secondary winding, a parameter of the plasma is determined. The parameter includes a resistance value associated with the plasma, a power value associated with the plasma, or both.

31 Claims, 3 Drawing Sheets

MEASURING AND CONTROLLING PARAMETERS OF A PLASMA GENERATOR

TECHNICAL FIELD

The description generally relates to measuring and controlling parameters of a plasma generator.

BACKGROUND

Plasma discharges can be used to excite gases to produce activated gases containing ions, free radicals, atoms and molecules. Activated gases are used in numerous industrial and scientific applications including processing solid materials such as semiconductor wafers, powders, and other gases.

Plasma can be generated in various ways including DC discharge, RF discharge, and microwave discharge. RF discharges produce high energy ions and, therefore, are often used to generate plasmas for applications where the material being processed comes into contact with the plasma. RF discharges can be achieved by electrostatically or inductively coupling energy from a power supply to a plasma. Inductively-coupled plasma generators typically employ complex power delivery systems. In addition, precision instrumentation is usually required to ascertain and/or control the power reaching the plasma.

Various approaches exist for ascertaining and/or controlling power reaching the plasma in an inductively-coupled plasma generator. For example, some approaches estimate plasma power using input voltage supplied to the plasma and/or current in the primary winding of the transformer for generating plasma. Existing approaches for determining parameters of plasmas produced in inductively-coupled plasma generators typically focus on either the primary-side or the secondary-side coils of the inductive element. One problem with existing approaches is a failure to provide direct or precise measurements of power delivered to the plasma, in part due to the distance of the measurement equipment from the inductive element and/or the presence of intervening elements. Another potential problem is failure of existing techniques to accurately estimate or characterize plasma resistance, due in part, again, to the distance of the measurement equipment from the inductive-element. Because plasma power and plasma resistance can be used to accurately and efficiently control power delivery to the plasma, ensure repeatability of the process for plasma generation, and diagnose process-related issues, better techniques for measuring and controlling functionality of plasma generators are needed.

SUMMARY

Because plasma power and plasma resistance can be used to accurately and efficiently control power delivery to the plasma, ensure repeatability of the process for plasma generation, and/or diagnose process-related issues, improved techniques for accurately and precisely measuring and controlling parameters or functionality of a plasma generator are desirable. The concepts described herein control parameters of a plasma generator based on electrical parameters or properties of the plasma produced, such as plasma resistance and plasma power. Advantageously, using plasma-related parameters to control functionality of plasma generators enhances the accuracy and/or precision with which plasma is produced and promotes repeatability of the process for operating a plasma generator.

One advantage of the described implementation that is realized results from positioning measurement equipment and sensors close to the inductive element, on both the primary side and the secondary side. Such a configuration allows more precise measurements and/or more accurate characterizations of the plasma behavior or properties. This advantage is achieved, in part, because the techniques involved do not characterize the plasma or its behavior with respect to the secondary-side of the inductive element based on measurements made only on the primary side of the inductive element, or vice versa (e.g., characterizing primary-side behavior of the plasma based only on secondary-side measurements). Instead, the present technique measures electrical parameters of both the primary and secondary side of the inductive element to model and characterize the generated plasma, e.g., to determine plasma resistance and/or plasma power.

In one aspect, there is a method. The method involves measuring a current of a primary winding of a transformer or other inductive element that generates a plasma and measuring a voltage across a secondary winding of the transformer. The method also involves determining a parameter of the plasma based on the current of the primary winding and the voltage across the secondary winding. The parameter includes a resistance value associated with the plasma, a power value associated with the plasma, or both.

Another aspect features a method for controlling a toroidal plasma. The method involves measuring a current of a primary winding of a transformer that generates the toroidal plasma and measuring a voltage across a secondary winding of the transformer. The method involves measuring an input voltage supplied to the transformer and estimating a power value of the plasma based on the current of the primary winding and the voltage across the secondary winding. The method involves regulating a power delivered to the plasma based on the estimated power value.

In another aspect, there is a system. The system includes a first module configured to measure a current of a primary winding of a transformer that generates a toroidal plasma and a voltage across a secondary winding of the transformer. The system includes a second module in communication with the first module, the second module configured to determine a parameter of the toroidal plasma based on the current of the primary winding and the voltage across the secondary winding. The parameter includes a resistance value associated with the plasma, a power value associated with the plasma, or both.

Yet another aspect relates to a toroidal plasma generator. The toroidal plasma generator includes a plasma chamber and a transformer or other inductive element having a magnetic core surrounding a portion of the plasma chamber and a primary winding. The toroidal plasma generator includes a power supply in electrical communication with the primary winding. The power supply supplies a current to the primary winding, and the supplied current induces a toroidal plasma in the plasma chamber. The toroidal plasma generator further includes a module for estimating a parameter of the toroidal plasma by measuring the current of the primary winding and a voltage across a secondary winding of the transformer. The parameter includes a resistance value associated with the toroidal plasma, a power value associated with the toroidal plasma, or both.

Another aspect involves a computer program product tangibly embodied in an information carrier. The information carrier is a non-transitory, computer-readable storage medium. The computer program product includes instructions operable to cause data processing apparatus to receive a measured value for a current of a primary winding of a transformer used to generate a plasma in a plasma chamber and a measured value for a voltage across a secondary winding of the transformer. The computer program product includes instructions operable to cause data processing apparatus to determine a parameter of the plasma based on the current of the primary winding and the voltage across the secondary winding according to a model of the plasma that relates the current of the primary winding to the current in the secondary winding and the voltage across the secondary winding. The parameter includes a resistance value associated with the plasma, a power value associated with the plasma, or both.

Any of the aspects above can include one or more of the following features in one or more embodiments. In some embodiments, the parameter of the plasma is determined based on a model of the plasma that relates the current of the primary winding to the current in the secondary winding and the voltage across the secondary winding. In some embodiments, the model of the plasma is updated based on measured values of the current of the primary winding and the voltage across the secondary winding. An iterative filter can be used to estimate the parameter of the plasma based on the model of the plasma. An example of an iterative filter is a Kalman filter.

Some embodiments involve determining a root-mean-square (RMS) equivalent of the current of the primary winding. Determining the RMS equivalent of the current of the primary winding can involve several steps, such as using a rectifier to rectify the current in the primary winding, using a differential amplifier in cooperation with a filter to compute an average of the rectified primary current, using a converter to sample the average primary current, and using a processor module to convert the sampled primary current to the RMS equivalent current of the primary winding.

Some embodiments involve determining an RMS equivalent of the voltage across the secondary winding. Determining the RMS equivalent of the voltage across the secondary winding can involve several steps, such as using a rectifier to rectify the voltage in the secondary winding, using a differential amplifier in cooperation with a filter to compute an average of the rectified secondary voltage, using a converter to sample the average secondary voltage and using a processor module to convert the sampled secondary voltage to the RMS equivalent voltage of the secondary winding.

In some embodiments, determining the parameter of the plasma includes the steps of estimating an RMS current of the secondary winding and an RMS voltage of the secondary winding, and estimating a phase between the estimated RMS current of the secondary winding and the RMS voltage of the secondary winding. Determining the parameter of the plasma can involve the steps of estimating the power value based on the estimated RMS current of the secondary winding, the RMS voltage of the secondary winding and the phase, and estimating the resistance value based on the RMS voltage of the secondary winding and the estimated power value. Determining the parameter of the plasma can involve repeating the above-recited steps until an error associated with estimating the resistance value satisfies a predetermined criterion such as, for example, when a difference between an estimated resistance value of the present iteration and an estimated resistance value of the previous iteration is below a threshold.

The RMS current of the secondary winding can be estimated based on an RMS current of the primary winding and a correction factor computed based on the resistance value, a core inductance value, and an angular frequency. Phase values can estimated based on the resistance value, a plasma inductance value, and a frequency.

Some embodiments feature regulation of the power delivered to the plasma based on a determined power value. Regulating the power delivered to the plasma can involve, for example, computing a difference between a predetermined power setpoint and the determined power value and determining a new power value based on the difference. The power is regulated, in some implementations, in a feedback loop.

In some embodiments, an input voltage supplied to the plasma is measured and used to compensate for input-line voltage ripple. Compensating for input-line voltage ripple can involve adjusting a switching frequency to regulate the power supplied to the plasma. Some examples involve monitoring at least one of the power value and the resistance value to detect an unsafe operating condition associated with a toroidal plasma chamber. A deviation of at least one of the power value and the resistance value from a predetermined value can be detected.

These and other features will be more fully understood by reference to the following description and drawings, which are illustrative and not necessarily to scale.

DETAILED DESCRIPTION

Figure 1:
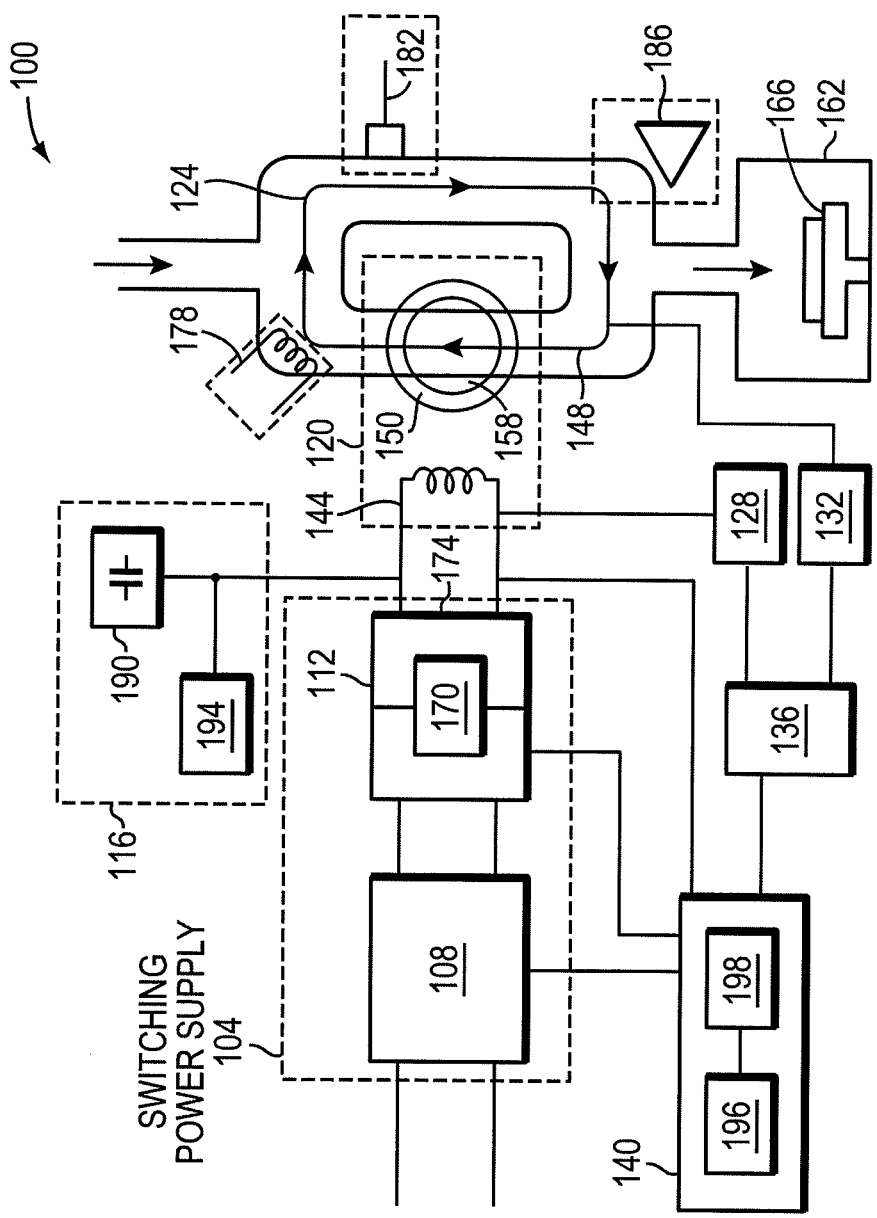
FIG. 1 is a block diagram illustrating an exemplary toroidal plasma generator.

FIG. 1 is a block diagram illustrating an exemplary toroidal plasma generator 100. The plasma generator 100 includes a switching power supply 104. The switching power supply 104 includes a voltage supply 108 coupled to and/or in electrical communication with a switching circuit 112. The plasma generator 100 includes an ignition control circuit 116 and a power transformer 120 for coupling electromagnetic energy into a plasma 124. The power transformer 120 (e.g., an inductive element) is in electrical communication with circuits 128 and 132 for measuring electrical parameters of the power transformer 120. The circuits 128 and 132 can be physical circuits implemented in hardware or logical circuits implemented in software, or a combination of these. A third circuit 136 communicates with the circuits 128 and 132 to compute certain parameters about the power transformer 120, the plasma 124, or of the plasma generator 100. The plasma generator 100 includes a control circuit 140 configured to accept electrical parameters (or values thereof) from circuit 128, circuit 132, and/or circuit 136 and, based on these inputs, regulates certain operations of the plasma generator 100 by adjusting various operational parameters to achieve desired properties of or in the plasma 124.

The power transformer 120 includes a primary coil 144, a secondary winding 148, a high permeability magnetic core 150, and a plasma chamber 158. The plasma chamber 158 allows the plasma 124 to form a secondary circuit (not shown) of the transformer 120. The power transformer 120 can include additional magnetic cores (not shown) and primary coils (not shown) that form additional secondary circuits (not shown).

The plasma chamber 158 can be formed from a metallic material such as aluminum or a refractory metal, or can be formed from a dielectric material such as quartz. One or more sides 160 of the plasma chamber 158 can be exposed to a process chamber 162 to allow charged particles generated by the plasma 124 to be in contact with a material to be processed (not shown). A sample holder 166 can be positioned in the process chamber 162 to support the material to be processed. The material to be processed can be biased relative to the potential of the plasma 124.

The voltage supply 108 can be a line voltage supply or a bus voltage supply. The switching circuit 112 includes one or more switching semiconductor devices 170 such as, for example, switching transistors. The one or more switching semiconductor devices 170 can be switching transistors. The switching circuit 112 can be a solid state switching circuit. An output 174 of the switching circuit 112 can be coupled to the primary winding 144 of the transformer 120 and/or in electrical communication therewith.

The plasma generator 100 can include a means (not shown) for generating free charges that provides an initial ionization event for igniting a plasma in the plasma chamber 158. In some embodiments, the ignition control circuit 116 controls and/or influences the initial ionization event. The initial ionization event can be a short, high voltage pulse that is applied to the plasma chamber 158. In some embodiments, the pulse has a voltage of approximately 500-10,000 volts and can last approximately 0.1 to 10 microseconds. A noble gas such as argon can be inserted into the plasma chamber 158 to induce the voltage required to ignite the plasma 124. Ultraviolet radiation can also be used to generate the free charges in the plasma chamber 158 that provide the initial ionization event for igniting the plasma 124 in the plasma chamber 158.

In some embodiments, the switching power supply 104 generates the short, high voltage electric pulse and applies it across the primary winding 144 of the transformer 120. This excitation voltage induces a high voltage current in the primary winding 144, thereby generating an alternating magnetic field through the magnetic core (not shown) across a path of the gas in the plasma chamber 158. As a result, current is induced within the gas of the plasma chamber 158, causing its ignition into a plasma 124. In some embodiments, a second transformer primary in the form of a winding 178 is introduced to assist ignition. The secondary primary winding 178 wraps about a portion of the magnetic core (not shown) of the transformer 120. When the power supply 102 applies the short, high voltage electric pulse across the primary winding 144, a current is induced within the secondary primary winding 178 according to a turn ratio. A lead of the secondary primary winding 178 is connected to one or more ignition electrodes (not shown) arranged about or within the plasma chamber 158. During plasma ignition, the voltage on the lead is applied to the ignition electrodes that capacitively couple energy to the gas flowing within the plasma chamber 158 to ignite and sustain a plasma. Other techniques for causing the initial ionization event that ignites a plasma also exist. For example, in some embodiments, the short, high voltage electric pulse is applied to an electrode 182 that is capacitively coupled to the plasma chamber 158 by a dielectric material (not shown). In some embodiments, the plasma chamber 158 is exposed to ultraviolet radiation from an ultraviolet light source 186 that is optically coupled to the plasma chamber 158. The ultraviolet radiation causes the initial ionization event that ignites the plasma. In any of these embodiments, the ignition control circuit 116 can control the application or parameters of electric pulses to the ignition elements (178, 182, 186).

In some embodiments, the ignition control circuit 116 increases the voltage of the primary winding 144 of the transformer 120 above its normal operating voltage prior to and/or during ignition and energizes the electrode 178 to provide initial ionization events to assist ignition. The ignition control circuit 116 can also control the current of the switching power supply 104 to protect circuit components in the switching circuit 112 and/or in the switching semiconductor devices 170 of the switching power supply 104, such as one or more MOSFETs, MOSFET drivers, charge resistors and discharge resistors. The ignition control circuit 116 can include a resonance capacitor 190 and a switching device 194. The resonance capacitor 190 is in electrical communication with the primary winding 144 and the switching power supply 104. The switching device 194 switches the resonance capacitor 190 on or off from the primary winding 144 and the switching power supply 104. The switching device 194 can be a mechanical switch or a solid-state switch.

The resonance capacitor 190 is connected in series with the primary winding 144 and the switching power supply 250. Prior to and during the ignition of the plasma 124, the control circuit 140 causes the switching device 194 to switch in the resonance capacitor 190 so that a resonant circuit is formed at the switching frequency of the switching power supply 104. The resonant circuit increases the voltage on the primary winding to a resonance voltage that can be between 1 to 10 times higher than the normal operating voltage supplied by the switching power supply 104.

In operation, a gas is bled into the plasma chamber 158 of the transformer 120 until a pressure substantially between 1 millitorr and 100 millitorr is reached. The gas can comprise a noble gas, a reactive gas or a mixture of at least one noble gas and at least one reactive gas. The switching circuit 112 supplies a current to the primary winding 144 that induces a potential inside the plasma chamber 158. The magnitude of the induced potential depends on the magnetic field produced by the core 150 and the frequency at which the switching semiconductor devices 170 operate according to Faraday's law of induction. An ionization event that forms the plasma can be initiated in the chamber 158.

Once the gas is ionized, the plasma 124 is formed which completes a secondary circuit (not shown) of the transformer 120. The electric field of the plasma can be substantially between 1-100 Volts/centimeter. If primarily noble gases are present in the plasma chamber 158, the electric fields in the plasma 124 can be as low as 1 Volt/centimeter. If electronegative gases are present in the chamber 158, the electric fields in the plasma 124 are considerably higher.

In some embodiments, the circuit 128 measures electrical parameters of the primary winding 144 of the transformer 120 and the circuit 132 measures electrical parameters of the secondary winding 148. Exemplary electrical parameters of the primary winding 144 include the current driving the primary winding 144, the voltage across the primary winding 144, and the bus or line voltage supply generated by the voltage supply 108. Exemplary electrical parameters of the secondary winding 148 include the current in the secondary winding 148 and the voltage across the secondary winding 148. The circuits 128 and 132 can also include means for processing and converting the measured electrical parameters to forms suitable for use by other components of the plasma generator 100. For example, the circuits 128 and 132 can convert or calculate raw voltage, resistance, or current values into root-mean-square (RMS) voltage, resistance, or current values. The computation circuit 136 uses electrical parameters measured from the primary and secondary windings 144, 148 (and communicated, respectively, by the circuits 128 and 132) to estimate parameters and/or properties associated with the plasma, such as plasma resistance and plasma power. Other parameters characterizing the plasma can also be determined or calculated based on the measured values.

The plasma generator 100 includes the control circuit 140 for regulating operation of the plasma generator 100. The control circuit 140 includes a controller module 196 and a summation module 198, at least one of which implements routines or processes to determine and/or realize desired parameters/properties for the plasma 124. The control circuit 140 can be implemented on one or more processors.

Figure 2:
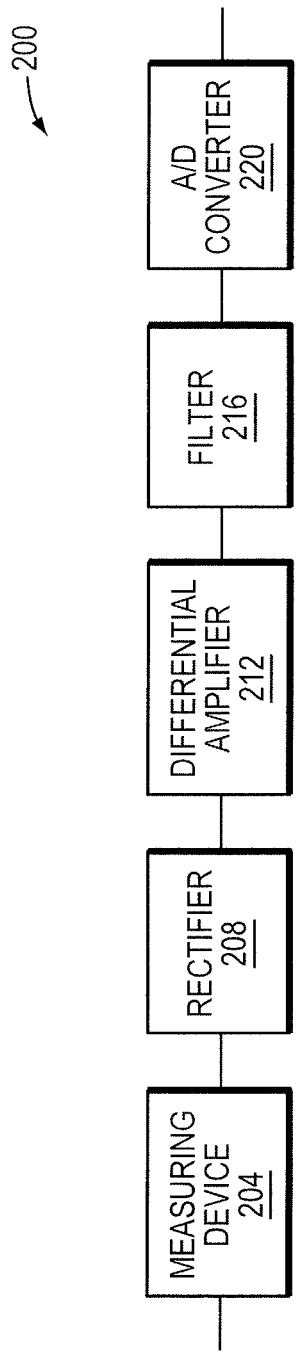
FIG. 2 is a block diagram illustrating an exemplary circuit for measuring and computing electrical parameters of the primary or secondary winding of a transformer.

FIG. 2 is a block diagram illustrating an exemplary configuration 200 describing the general flow for calculating properties of the inductive element of an inductively-coupled plasma generator. The configuration 200 can be used in cooperation with the circuit 128 in communication with the primary winding 144 of FIG. 1. The circuit 128 measures and processes electrical parameters of the primary winding 144 of the transformer 120. The configuration 200 can be used in cooperation with the circuit 132 for measuring and processing electrical parameters of the secondary winding 148. In some embodiments, circuit 128 (in the configuration 200 shown in FIG. 2) measures a sinusoidal current in the primary winding 144 and converts the measured current to a form suitable for use by the computation circuit 136. In some embodiments, circuit 132 (in the configuration 200 shown in FIG. 2) measures a sinusoidal voltage in the secondary winding 148 and converts the measured voltage to a form suitable for use by the computation circuit 136. The configuration 200 includes a measuring device 204 in electrical communication with a rectifier element 208. An output of the rectifier element 208 is coupled to and/or in electrical communication with a differential amplifier element 212 and a filter element 216 which, in turn, communicate with an analog-to-digital converter element 220.

In some embodiments, the measuring device 204 is a sensor to measure current in the primary winding 144. The resulting current measurement is converted to a rectified current with or by the rectifier element 208. The rectifier element 208 can be, for example, a full-wave rectifier. The rectified current is supplied to and processed by the differential amplifier element 212 and the filter element 216 to generate an average current. In some embodiments, the filter element 216 is a Sallen-key filter. The analog-to-digital converter element 220 then samples the average current to generate a sampled average current of the primary winding 144.

In some embodiments, the measuring device 204 is an ohmic divider to measure voltage across the secondary winding 148. The measured voltage is converted to a rectified voltage with the rectifier element 208. In some embodiments, the rectifier element 208 is a full-wave rectifier. The rectified voltage is supplied to and processed by the differential amplifier element 212 and the filter element 216 to generate an average voltage. In some embodiments, the filter element 216 is a Sallen-key filter. The analog-to-digital converter 220 element then samples the average voltage to generate a sampled average voltage across the secondary winding 148. The configuration 200 (or elements 208, 212, 216, or 220 thereof) can be implemented on one or more processors regardless of whether the configuration 200 cooperates with the circuit 128, the circuit 132, or both.

Figure 3:
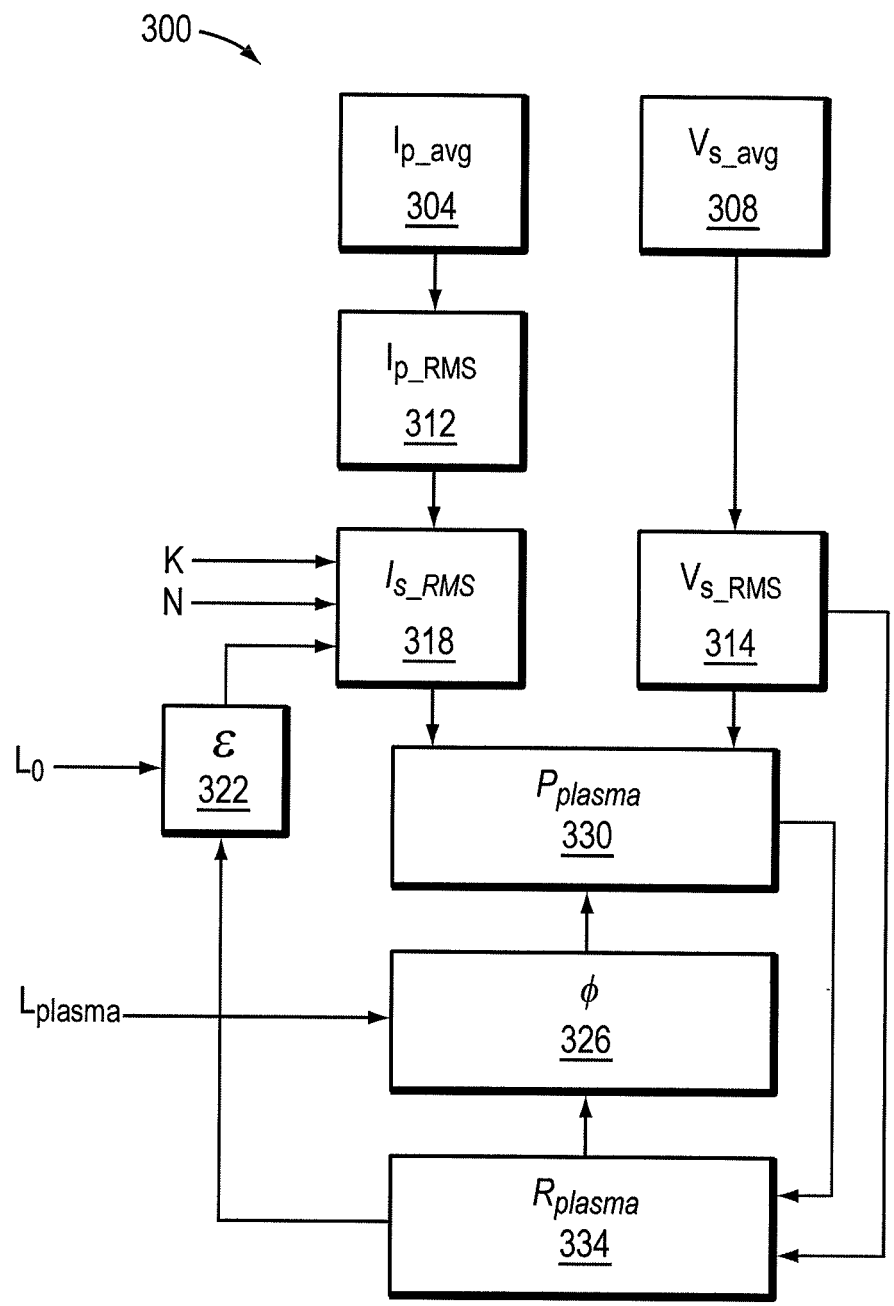
FIG. 3 is a block diagram illustrating an exemplary circuit for computing electrical parameters related to a plasma.

FIG. 3 is a block diagram illustrating an exemplary computation circuit 300 illustrating a general flow for determining parameters of a plasma in an inductively-coupled plasma generator. The computation circuit 300 can be used, for example, in cooperation with the computation circuit 136 of FIG. 1 for computing plasma resistance and/or plasma power based on electrical parameters or values of the primary winding 144 and secondary winding 148 of the power transformer 120. An input 304 of the computation circuit 300 can be the sampled average current in the primary winding determined by circuit 128 (e.g., calculated as discussed with respect to FIG. 2). Another input 308 can be the sampled average voltage across the secondary winding determined by circuit 132 (e.g., calculated as discussed with respect to FIG. 2).

In some embodiments, the computation circuit 300 implements mathematical algorithms that model aspects or features of the plasma. For example, the electrical properties of a plasma can be modeled by, e.g., relating the current in the primary winding 144 of the transformer 120 to the current and/or voltage of the secondary winding 148 of the transformer 120. Electrical parameters of a plasma, such as plasma resistance and plasma power, can be estimated based on the current and/or voltage of the secondary winding 148 as they relate to the current in the primary winding 144. Moreover, the measured parameters of the plasma can be used or incorporated to update or refine the model, based on observed properties or parameters measured during operation.

FIG. 3 illustrates an exemplary technique for determining parameters or properties of a plasma based on a model of the function of a plasma and for updating features of the model based on the determined parameters or properties. Input 304 is provided to module 312. In some embodiments, module 312 converts the sampled average current in the primary winding ($I_{p\_avg}$) provided by input 304 to an equivalent root-mean-square (RMS) value ($I_{p\_RMS}$) based on the following equation:

$$I_{p\_RMS} = \frac{\pi}{2\sqrt{2}} I_{p\_avg}.$$

An output of module 312 is communicated to module 318. In some embodiments, module 318 computes an RMS current of the secondary winding ($I_{s\_hd\ RMS}$) based on the estimated RMS current of the primary winding ($I_{p\_RMS}$) provided by module 312 using the following equation:

$$I_{s\_RMS} = \frac{kN}{\sqrt{1+\varepsilon^2}} I_{p\_RMS},$$

where k is a coupling coefficient of the transformer 120, N represents the number of turns of the primary coil 144 around the transformer core 150 and $\in$ is a plasma resistance correction factor. In some embodiments, N is 2. The above equation relates the current in the primary winding 144 to the current in the secondary winding 148.

In some embodiments, the plasma resistance correction factor ($\in$) is computed by module 322 as follows:

$$\varepsilon = \frac{R_{plasma}}{\omega L_0},$$

where $L_0$ is a inductance of the core 150, $\omega$ is an angular frequency, and $R_{plasma}$ is a plasma resistance. The core inductance ($L_0$) can be a system constant that is measured a priori. The core inductance ($L_0$) can also be determined dynamically during the computational process. The plasma resistance ($R_{plasma}$) is computed at module 334, explained in more detail below.

Input 308 is provided to module 314. In some embodiments, module 314 converts the sampled average voltage across the secondary winding ($V_{s\_avg}$) provided by input 308 to an equivalent RMS value ($V_{s\_RMS}$) using the following equation:

$$V_{s\_RMS} = \frac{\pi}{2\sqrt{2}} V_{s\_avg}.$$

Module 326 estimates a phase (φ) between the voltage across the secondary winding 148 and the current in the secondary winding 148 using the following equation:

$$\phi = \tan^{-1}\left\{\frac{2\pi f * L_{plasma}}{R_{plasma}}\right\},$$

where f is a frequency of the processor on which circuit 300 is implemented, $L_{plasma}$ is a plasma inductance and $R_{plasma}$ is the plasma resistance. In some embodiments, at least one of the frequency (f) and the plasma inductance ($L_{plasma}$) is known a priori. In some embodiments, at least one of the frequency (f) and plasma inductance ($L_{plasma}$) is determined dynamically (or iteratively, via the computation of the plasma parameters). The plasma resistance ($R_{plasma}$) can be computed at module 334, explained in more detail below.

Outputs from modules 314, 318 and 326 are provided to module 330 to compute a value for the power delivered to the plasma ($P_{plasma}$) using the following equation:

$$P_{plasma} = V_{s\_RMS} I_{s\_RMS} \cos(\phi),$$

where $V_{s\_RMS}$ is the RMS voltage across the secondary winding 148 obtained from module 314, $I_{s\_RMS}$ is the RMS current in the secondary winding 148 obtained from module 318, and φ is the angle between the RMS voltage and the RMS current obtained from module 326.

Outputs of modules 314 and 330 are provided to module 334 that estimates the plasma resistance ($R_{plasma}$) using the following differential equation:

$$\frac{dR_{plasma}}{dt} = \frac{1}{\tau}\left\{\frac{V_{s\_RMS}^2}{P_{plasma}} - R_{plasma}\right\},$$

where $V_{s\_RMS}$ is the RMS voltage across the secondary winding 148 obtained from module 314, $P_{plasma}$ is the plasma power obtained from module 330, and τ is a time constant associated with an iterative filter used to estimate the value of plasma resistance ($R_{plasma}$) by solving the differential equation. The filter for solving the differential equation can be a Kalman filter. The filter (or an operator) can select an initial estimate of the plasma resistance ($R_{plasma}$) to affect or optimize convergence of the iterative process. For example, the initial value of the plasma resistance $$(R_{plasma}) \text{ can be } \frac{V_{s\_RMS}}{I_{s\_RMS}}.$$

In some embodiments, computation in modules 318-334 is iteratively repeated until the process converges at which point an error associated with estimating the resistance value satisfies a predetermined criterion. An example of a predetermined criterion is when the difference between an estimated resistance value in the present iteration and an estimated resistance value in the previous iteration is below a threshold.

At least a portion of modules 304-334 of the computation circuit 300 implement mathematical algorithms to estimate plasma-related properties, such as, for example, plasma power and/or plasma resistance. The computation circuit 300 can be implemented on one or more processors. In some embodiments, the computation circuit 300 is implemented on a digital signal processor.

With reference to FIG. 1, control circuit 140 can regulate operation of the plasma generator 100 based on computations and/or measurements obtained from at least one of the computation circuit 136, the circuit 128 for measuring and processing electrical parameters of the primary winding 144, and the circuit 132 for measuring and processing electrical parameters of the secondary winding 148. In some embodiments, the control circuit 104 regulates ignition voltage prior to and/or during plasma ignition based on the voltage across the secondary winding 148 measured by the circuit 132. In some embodiments, the control circuit 104 regulates power supplied to the plasma load 124 after plasma ignition based on the plasma power computed at the circuit 136. In some embodiments, the control circuit 104 regulates current driving the plasma load 124 after plasma ignition based on the current in the secondary winding 148 computed by the circuit 136.

In some embodiments, after ignition of the plasma 124, the power delivered to the plasma 124 is regulated using a feedback loop comprising the computation circuit 136, the control circuit 140, and the switching power supply 104. More specifically, the control circuit 140 uses the plasma power estimated by the computation circuit 136 to adjust operation of the switching power supply 104, thereby controlling power delivered to the plasma load 124. In some embodiments, after ignition of the plasma 124, the power delivered to the plasma 124 is regulated using a feed-forward loop comprising the voltage supply 108, the control circuit 140, and the switching circuit 112. The control circuit 140 can use the voltage generated by the voltage supply 108 to adjust operating parameters of the switching circuit 112, such as to compensate for input line voltage ripple, which in turn controls power delivery to the plasma load 124.

In some embodiments, after ignition of the plasma 124, the current driving the plasma load 124 is regulated using a feedback loop that includes the computation circuit 136, the control circuit 140 and the switching power supply 104. For example, the control circuit 140 uses the current in the secondary winding estimated by the computation circuit 136 to adjust operation of the switching power supply 104, thereby controlling current driving the plasma load 124.

Prior to and/or during ignition of the plasma 124, ignition voltage can be regulated using a feedback loop that includes the circuit 132 for measuring electrical parameters of the secondary winding, the control circuit 140, and the switching power supply 104. For example, the control circuit 140 uses the voltage across the secondary winding measured by the circuit 132 to adjust operation of the switching power supply 104 prior to and/or during ignition of the plasma load 124 to control the ignition voltage.

After plasma ignition, to facilitate control of power delivered to the plasma 124 with the control circuit 104, the summation module 198 accepts as an input an estimation of the power delivered to the plasma load ($P_{plasma}$) computed by the computation circuit 136. An operator or the controller module 196 provides a power setpoint signal ($P_{sp}$) to the summation module 198 that defines a desired power at the plasma load 124. The summation module 198 then calculates a power offset (e) as the difference between the power setpoint signal ($P_{sp}$) and the estimated plasma power ($P_{plasma}$) based on the following:

$$e = P_{sp} - P_{plasma},$$

If the power offset is zero, the plasma generator is deemed to be operating under acceptable (or optimal) conditions and no adjustment to achieve the desired power at the plasma load occurs. If the power offset is not zero, the controller module 196 operates to minimize the offset.

The controller module 196 receives the power offset value as an output from the summation module 198 and attempts to minimize the offset by calculating a value and then directing a corrective action to adjust the operation of the switching power supply 104. The controller module 196 can be a state-space controller, an adaptive controller, or a fuzzy-logic controller. In some embodiments, the controller module 408 is a proportional-integral-derivative (PID) controller that uses a PID algorithm to compute the necessary corrective action. The "proportional" value of the PID algorithm predicts, determines or is associated with the reaction of the controller module 196 to the current offset. The "integral" value of the PID algorithm predicts, determines or is associated with the reaction of the controller module 196 based on the sum of recent offsets. The "derivative" value of the PID algorithm predicts, determines or is associated with the reaction of the controller module 196 based on the rate at which the offset has changed. The PID algorithm can optionally include an additional term that predicts, determines or is associated with the reaction of the controller module 196 as a function of the input voltage to compensate for input-line voltage ripple. The controller module 196 uses a weighted sum of these four actions to adjust the plasma-generation process based on the following equation:

$$f_{control} = k_p e + k_i \int e \cdot d\tau + k_d \frac{de}{dt} + f(V_{in}),$$

where $k_p$ is the value of the scalar constant for the "proportional" component of the PID control algorithm, $k_i$ is the value of the scalar constant for the "integral" component of the PID control algorithm, $k_d$ is the value of the scalar constant for the "derivative" component of the PID control algorithm, and e is the power offset obtained from the output of summation module 198. In addition, $V_{in}$ is the input voltage generated by the voltage supply 108. In general, by tuning the three scalar constants (k) and the optional input voltage function of the PID algorithm, the controller module 196 can provide control action designed for user-desired process requirements.

After plasma ignition, to facilitate control of the current delivered to the plasma 124 with the control circuit 104, the summation module 198 accepts as an input an estimation of the current in the secondary winding ($I_s$) computed by the computation circuit 136. An operator or the controller module 196 provides a current setpoint signal ($I_{sp}$) to the summation module 198 that defines a desired current for the plasma load 124. The summation module 198 then calculates a current offset ($e_i$) as the difference between the current setpoint signal ($I_{sp}$) and the estimated current in the secondary winding ($I_s$) based on the following equation:

$$e_i = I_{sp} - I_s.$$

If the current offset is zero, the plasma generator 100 is deemed to be operating under acceptable (or optimal) conditions and no adjustment to achieve the desired current for the plasma load 124 occurs. If the current offset is not zero, the controller module 196 operates to minimize the offset.

The controller module 196 receives the current offset value as an output from the summation module 198 and attempts to minimize the offset by calculating a value and then directing a corrective action to adjust the operation of the switching power supply 104. The controller module 196 can be a state-space controller, an adaptive controller, or a fuzzy-logic controller. In some embodiments, the controller module 196 is a PID controller that uses a weighted sum of the "proportional" value, the "integral" value and the "derivative" value of the PID algorithm to control current driving the plasma load 124.

Prior to and/or during plasma ignition, to facilitate control of the ignition voltage with the control circuit 104, the summation module 198 accepts as an input a voltage across the secondary winding 148 ($V_s$) measured by the circuit 132. An operator or the controller module 196 provides a voltage setpoint signal ($V_{sp}$) to the summation module 198 that defines a desired ignition voltage to be achieved prior to and/or during ignition. The summation module 198 then calculates a voltage offset ($e_v$) as the difference between the voltage setpoint signal ($V_{sp}$) and the measured voltage across the secondary winding 148 ($V_s$) based on the following equation:

$$e_v = V_{sp} - V_s.$$

If the voltage offset is zero, the plasma generator 100 is deemed to be operating under acceptable (or optimal) conditions and no adjustment to achieve the desired ignition voltage occurs. If the voltage offset is not zero, the controller module 196 operates to minimize the offset.

The controller module 196 receives the voltage offset value as an output from the summation module 198 and attempts to minimize the offset by calculating a value and then directing a corrective action to adjust the operation of the switching power supply 104. The controller module 196 can be a state-space controller, an adaptive controller, or a fuzzy-logic controller. In some embodiments, the controller module 408 is a PID controller that uses a weighted sum of the "proportional" value, the "integral" value and the "derivative" value of the PID algorithm to control ignition voltage.

The controller module 196 outputs one or more signals to adjust the operation of the switching power supply 104 which, in turn, controls the power, voltage and/or current delivered to the plasma load 124. In some embodiments, the controller module 196 facilitates control by adjusting the duty cycle of the switching power supply 104 while keeping the switching frequency fixed or relatively constant. In some embodiments, the controller module 196 facilitates control by adjusting the switching frequency of the switching power supply 104 while keeping the duty cycle fixed. In some embodiments, the controller module 196 facilitates control by adjusting the switching frequency and the duty cycle of the switching power supply 104 substantially simultaneously. In some embodiments, the switching frequency is adjusted within the range of 270 kHz and 480 kHz.

In an exemplary implementation, the electrical parameters associated with the primary winding 144, the secondary winding 148 and the plasma 124 are used to monitor the operation of the plasma generator 100 shown in FIG. 1. For example, the electrical parameters can be used to characterize process performance. Hence, these parameters can be monitored to ensure that the plasma generator 100 is being operated within specified or desired operating ranges and conditions. In addition, the electrical parameters can be used for diagnostic purposes. For example, certain process parameters such as voltage across the primary winding 144 and secondary winding 148, current in the primary winding 144 and secondary winding 148, plasma 124 power, plasma 124 resistance and frequency can be stored and/or tracked. In some embodiments, analysis of such historical data is used to monitor the health or performance of the plasma generator 100 by detecting deviations between the current operational parameters and the historical trend corresponding to the respective parameters. In addition, historical information can be used to detect the location and timing of faults in the operational process and to determine causes of these faults. Furthermore, the electrical parameters can be used to ensure repeatability of the plasma-generation process so that consistent operational standard is maintained.

The above-described techniques can be implemented in digital electronic circuitry, or in computer hardware, firmware, software, or in combinations of them. The implementation can be as a computer program product, e.g., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Data transmission and instructions can also occur over a communications network. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The terms "module" and "function," as used herein, mean, but are not limited to, a software or hardware component which performs certain tasks. A module may advantageously be configured to reside on addressable storage medium and configured to execute on one or more processors. A module may be fully or partially implemented with a general purpose integrated circuit (IC), a field programmable gate array (FPGA), or an application-specific integrated circuit (ASIC). Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules.

To provide for interaction with a user, the above described techniques can be implemented on a computer having a display device, e.g., a CRT (cathode ray tube) or LCD (liquid crystal display) monitor or touchscreen display, for displaying information to the user and a keyboard and a pointing device, e.g., a mouse or a trackball, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The above described techniques can be implemented in a distributed computing system that includes a back-end component, e.g., as a data server, and/or a middleware component, e.g., an application server, and/or a front-end component, e.g., a client computer having a graphical user interface and/or a Web browser through which a user can interact with an example implementation, or any combination of such back-end, middleware, or front-end components.

The technology has been described in terms of particular embodiments. The alternatives described herein are examples for illustration only and not to limit the alternatives in any way. The steps of the technology can be performed in a different order and still achieve desirable results. Other embodiments are within the scope of the following claims.

What is claimed is:

1. A method comprising:
   measuring a current of a primary winding of a transformer that generates a plasma;
   measuring a voltage across a secondary winding of the transformer; and
   determining a parameter of the plasma comprising a resistance value associated with the plasma, or a power value associated with the plasma, or both, wherein determining the parameter of the plasma comprises:
      estimating a current in the secondary winding based on the current of the primary winding; and
      estimating the parameter based on the current in the secondary winding and the voltage across the secondary winding.

2. The method of claim 1, further comprising updating the parameter of the plasma based on measured values of the current of the primary winding and the voltage across the secondary winding.

3. The method of claim 1, further comprising determining a root-mean-square (RMS) equivalent of the current of the primary winding and determining an RMS equivalent of the voltage across the secondary winding.

4. The method of claim 3, wherein determining the RMS equivalent of the current of the primary winding comprises:
   rectifying the current in the primary winding;
   computing an average of the rectified primary current;
   sampling the average of the rectified primary current; and
   converting the sampled average of the rectified primary current to the RMS equivalent current of the primary winding.

5. The method of claim 3, wherein determining the RMS equivalent of the voltage across the secondary winding comprises:
   rectifying the voltage in the secondary winding;
   computing an average of the rectified secondary voltage;
   sampling the average of the rectified secondary voltage; and
   converting the sampled average of the rectified secondary voltage to the RMS equivalent voltage of the secondary winding.

6. The method of claim 1, wherein determining the parameter of the plasma comprises the steps of:

(a) estimating an RMS current of the secondary winding and an RMS voltage of the secondary winding;
(b) estimating a phase between the estimated RMS current of the secondary winding and the RMS voltage of the secondary winding;
(c) estimating the power value based on the estimated RMS current of the secondary winding, the RMS voltage of the secondary winding and the phase;
(d) estimating the resistance value based on the RMS voltage of the secondary winding and the estimated power value; and
(e) repeating steps (a) through (d) until an error associated with estimating the resistance value satisfies a predetermined criterion.

7. The method of claim 6, wherein the RMS current of the secondary winding is estimated based on an RMS current of the primary winding and a correction factor computed based on the resistance value, a core inductance value, and an angular frequency.

8. The method of claim 6, wherein the phase is estimated based on the resistance value, a plasma inductance value, and a frequency.

9. The method of claim 1, further comprising regulating power delivered to the plasma based on the determined power value.

10. The method of claim 9, wherein regulating the power delivered to the plasma comprises the steps of:
computing a difference between a predetermined power setpoint and the determined power value; and
determining a new power value based on the difference.

11. The method of claim 9, wherein the power is regulated in a feedback loop.

12. The method of claim 1, further comprising measuring an input voltage supplied to the plasma and compensating for input-line voltage ripple based on the input voltage.

13. The method of claim 12, wherein compensating for input-line voltage ripple comprises adjusting a switching frequency to regulate the power supplied to the plasma.

14. The method of claim 1, further comprising monitoring at least one of the power value and the resistance value to detect an unsafe operating condition associated with a toroidal plasma chamber.

15. The method of claim 1, further comprising detecting a deviation of at least one of the power value and the resistance value from a predetermined value.

16. A method for controlling a toroidal plasma, the method comprising:
measuring a current of a primary winding of a transformer that generates the toroidal plasma;
measuring a voltage across a secondary winding of the transformer;
measuring an input voltage supplied to the transformer;
estimating a power value of the plasma comprising: i) determining a current in the secondary winding using the current of the primary winding and ii) estimating the power value based on the current in the secondary winding and the voltage across the secondary winding; and
regulating a power delivered to the plasma based on the estimated power value.

17. The method of claim 16, wherein regulating the power delivered to the plasma comprises the steps of:
computing a difference between a predetermined power setpoint and the estimated power value; and
determining a new power value based on the difference.

18. The method of claim 17, wherein the power is regulated in a feedback loop.

19. The method of claim 16, further comprising compensating for input-line voltage ripple based on the measured input voltage.

20. The method of claim 19, wherein compensating for input-line voltage ripple comprises adjusting a switching frequency based on the measured input voltage.

21. A toroidal plasma generator, comprising:
a plasma chamber;
a transformer having a magnetic core surrounding a portion of the plasma chamber and a primary winding;
a power supply in electrical communication with the primary winding, the power supply supplying a current to the primary winding, and the supplied current inducing a toroidal plasma in the plasma chamber; and
a module for estimating a parameter of the toroidal plasma by i) measuring the current of the primary winding and a voltage across a secondary winding of the transformer, ii) determining a current in the secondary winding based on the current of the primary winding; and iii) estimating the parameter based on the current in the secondary winding and the voltage across the secondary winding, the parameter comprising a resistance value associated with the toroidal plasma, or a power value associated with the toroidal plasma, or both.

22. A system comprising:
a first module configured to measure a current of a primary winding of a transformer that generates a toroidal plasma and a voltage across a secondary winding of the transformer; and
a second module in communication with the first module, the second module configured to determine a parameter of the toroidal plasma comprising a resistance value associated with the plasma, or a power value associated with the plasma, or both, wherein the parameter is determined by i) determining a current in the secondary winding based on the current of the primary winding; and ii) estimating the parameter based on the current in the secondary winding and the voltage across the secondary winding.

23. The system of claim 22, further comprising a third module configured to determine an RMS equivalent of the current of the primary winding and an RMS equivalent of the voltage across the secondary winding.

24. The system of claim 23, wherein the third module comprises:
a rectifier configured to rectify the current in the primary winding;
a differential amplifier in cooperation with a filter configured to compute an average of the rectified primary current;
a converter configured to sample the average of the rectified primary current; and
a processor module configured to convert the sampled average of the rectified primary current to the RMS equivalent current of the primary winding.

25. The system of claim 23, wherein the third module comprises:
a rectifier configured to rectify the voltage across the secondary winding;
a differential amplifier in cooperation with a filter configured to compute an average of the rectified secondary voltage;
a converter configured to sample the average of the rectified secondary voltage; and
a processor module configured to convert the sampled average of the rectified secondary voltage to the RMS equivalent voltage of the secondary winding.

26. The system of claim 22, wherein the second module includes an iterative filter configured to estimate the parameter of the plasma based on a model of the plasma that relates the current of the primary winding to the voltage across the secondary winding.

27. A computer program product, tangibly embodied in a non-transitory information carrier, the computer program product including instructions being operable to cause a data processing apparatus to:
receive a measured value of a current of a primary winding of a transformer used to generate a plasma in a plasma chamber;
receive a measured value of a voltage across a secondary winding of the transformer; and
determine a parameter of the plasma comprising a resistance value associated with the plasma, or a power value associated with the plasma, or both, wherein the parameter is determined by i) determining a current in the secondary winding based on the current of the primary winding and ii) estimating the parameter based on the current in the secondary winding and the voltage across the secondary winding.

28. A method comprising:
measuring a current of a primary winding of a transformer that generates a plasma;
measuring a voltage across a secondary winding of the transformer; and
determining a parameter of the plasma based on i) an RMS equivalent of the current of the primary winding and ii) an RMS equivalent of the voltage across the secondary winding, the parameter comprising a resistance value associated with the plasma, or a power value associated with the plasma, or both.

29. A method for controlling a toroidal plasma, the method comprising:
measuring a current of a primary winding of a transformer that generates the toroidal plasma;
measuring a voltage across a secondary winding of the transformer;
measuring an input voltage supplied to the transformer;
estimating a power value of the plasma based on an RMS equivalent of the current of the primary winding and an RMS equivalent of the voltage across the secondary winding; and
regulating a power delivered to the plasma based on the estimated power value.

30. A system comprising:
a first module configured to measure a current of a primary winding of a transformer that generates a toroidal plasma and a voltage across a secondary winding of the transformer; and
a second module in communication with the first module, the second module configured to determine a parameter of the toroidal plasma based on i) an RMS equivalent of the current of the primary winding and ii) an RMS equivalent of the voltage across the secondary winding, the parameter comprising a resistance value associated with the plasma, or a power value associated with the plasma, or both.

31. A computer program product, tangibly embodied in a non-transitory information carrier, the computer program product including instructions being operable to cause a data processing apparatus to:
receive a measured value of a current of a primary winding of a transformer used to generate a plasma in a plasma chamber;
receive a measured value of a voltage across a secondary winding of the transformer; and
determine a parameter of the plasma according to a model relating the parameter of the plasma to i) an RMS equivalent of the current of the primary winding and ii) an RMS equivalent of the voltage across the secondary winding, the parameter comprising a resistance value associated with the plasma, or a power value associated with the plasma, or both.

* * * * *